United States Patent
Mulders et al.

(10) Patent No.: US 11,834,193 B2
(45) Date of Patent: Dec. 5, 2023

(54) DUAL POLE SWITCH DETECTION CIRCUIT

(71) Applicant: B/E Aerospace, Inc., Winston Salem, NC (US)

(72) Inventors: Dennis Mulders, Nieuwegein (NL); Hans Huijsing, Ijsselstein (NL)

(73) Assignee: B/E Aerospace, Inc., Winston Salem, NC (US)

( * ) Notice: Subject to any disclaimer, the term of this patent is extended or adjusted under 35 U.S.C. 154(b) by 0 days.

(21) Appl. No.: 17/965,361

(22) Filed: Oct. 13, 2022

(65) Prior Publication Data
US 2023/0040641 A1 Feb. 9, 2023

Related U.S. Application Data

(63) Continuation of application No. 17/111,860, filed on Dec. 4, 2020, now Pat. No. 11,492,133.

(60) Provisional application No. 63/050,919, filed on Jul. 13, 2020.

(51) Int. Cl.
*B64D 41/00* (2006.01)
*B64D 11/04* (2006.01)
*G05F 1/625* (2006.01)

(52) U.S. Cl.
CPC .............. *B64D 41/00* (2013.01); *B64D 11/04* (2013.01); *G05F 1/625* (2013.01)

(58) Field of Classification Search
None
See application file for complete search history.

(56) References Cited

U.S. PATENT DOCUMENTS

| | | |
|---|---|---|
| 6,608,398 B2 | 8/2003 | Masaoka |
| 7,459,910 B2 | 12/2008 | Kawamura et al. |
| 10,475,612 B2 | 11/2019 | Zhang et al. |
| 2008/0204953 A1* | 8/2008 | Shuey ............... G01R 11/25 361/60 |
| 2014/0015517 A1 | 1/2014 | Iwata |
| 2016/0167528 A1* | 6/2016 | Yang ................ H02M 7/493 307/9.1 |

(Continued)

FOREIGN PATENT DOCUMENTS

| | | |
|---|---|---|
| CN | 206339637 U | 7/2017 |
| EP | 3214454 A1 | 9/2017 |

OTHER PUBLICATIONS

Extended European Search Report dated Nov. 29, 2021, issued during the prosecution of European Patent Application No. EP 21185407.0.

*Primary Examiner* — Jared Fureman
*Assistant Examiner* — Aqeel H Bukhari
(74) *Attorney, Agent, or Firm* — Locke Lord LLP; Joshua L. Jones; Gabriella D' Angelo

(57) ABSTRACT

A system includes three switches each having a single pole and dual throws. The respective single pole is on a supply side of the each respective switch. The dual throws are on a load side of each respective switch, and include a respective normally open (NO) throw and a respective normally closed (NC) throw. A first voltage detector is connected from the single pole of the first switch to the NC throw of the third switch. A second voltage detector is connected from the single pole of the second switch to the NC throw of the first (Continued)

switch. A third voltage detector is connected from the single pole of the third switch to a NC throw of the second switch.

7 Claims, 1 Drawing Sheet

(56) References Cited

U.S. PATENT DOCUMENTS

2019/0173466 A1  6/2019  Prevost et al.

* cited by examiner

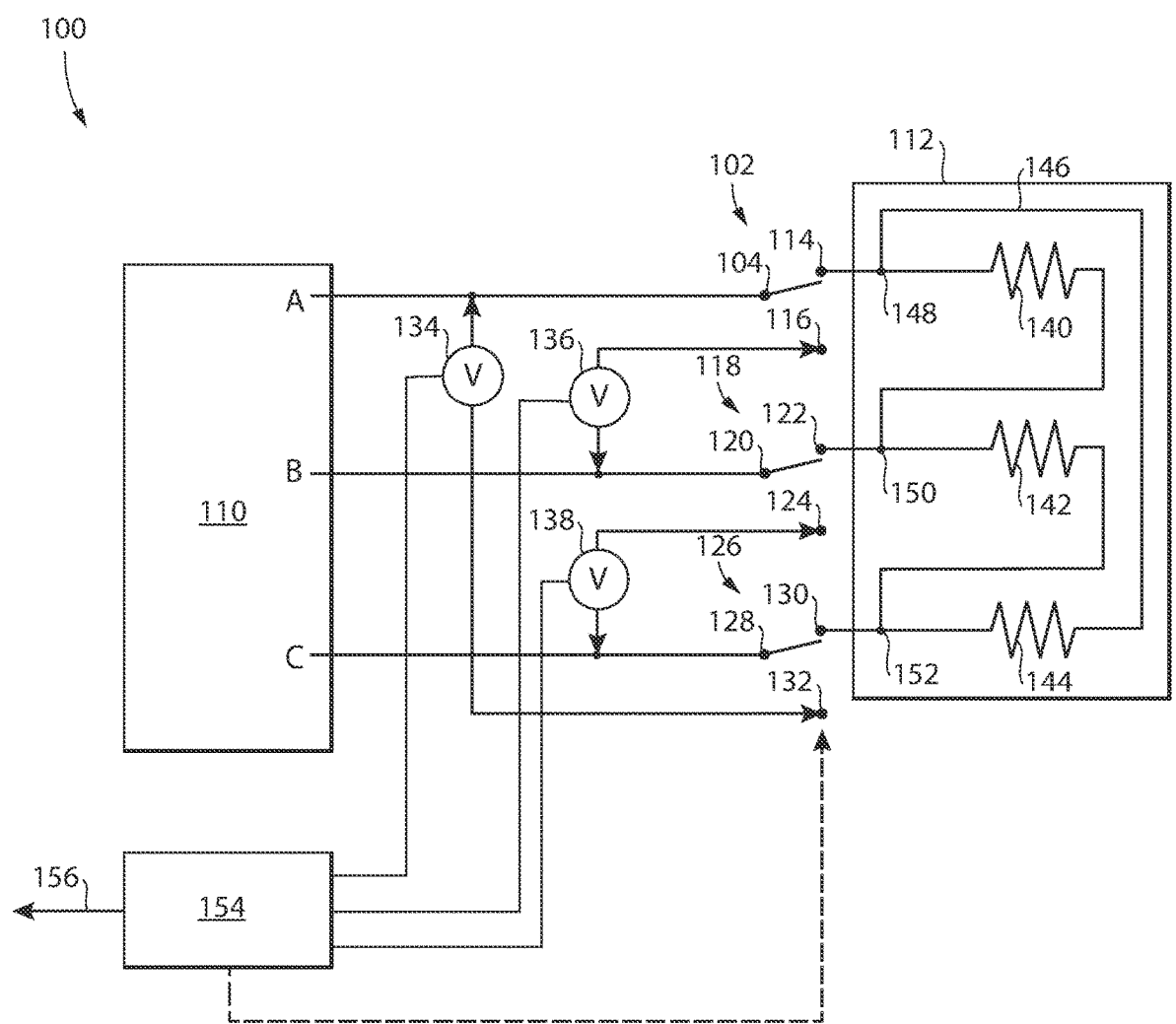

DUAL POLE SWITCH DETECTION CIRCUIT

CROSS-REFERENCE TO RELATED APPLICATIONS

This is a continuation of U.S. patent application Ser. No. 17/111,860 filed Dec. 4, 2020, which claimed benefit of priority to U.S. Provisional Patent Application Ser. No. 63/050,919 filed Jul. 13, 2020. Both of the applications listed above are incorporated by reference herein in their entireties.

BACKGROUND

1. Field

The present disclosure relates to power handling, and more particularly to detecting three phase power, e.g., for ovens or other equipment in aircraft.

2. Description of Related Art

Three-phase power supplied to an aircraft oven can be disabled when a safety system detects a problem. The switches used to disconnect this power can themselves fail in various failure modes, so it is necessary to monitor the switches. In case one switch fails, the other switches can be disabled, assuring system safety. A typical state monitoring system for the switches is performed by comparing the voltage on a power line before and after switching the switch to compare with the intended state.

The conventional techniques have been considered satisfactory for their intended purpose. However, there is an ever present need for improved systems and methods for detecting states in switches, such as for powering ovens in aircraft or the like, especially when no neutral is available for reference. This disclosure provides a solution for this need.

SUMMARY

A system includes a first switch having a single pole and dual throws. The single pole is on a supply side of the first switch. The dual throws are on a load side of the first switch, and include a normally open (NO) throw and a normally closed (NC) throw. A second switch has a single pole and dual throws. The single pole is on a supply side of the second switch. The dual throws are on a load side of the second switch, and include a NO throw and a NC throw. A third switch has a single pole and dual throws. The single pole is on a supply side of the third switch. The dual throws are on a load side of the third switch, and include a NO throw and a NC throw. A first voltage detector is connected from the single pole of the first switch to the NC throw of the third switch. A second voltage detector is connected from the single pole of the second switch to the NC throw of the first switch. A third voltage detector is connected from the single pole of the third switch to a NC throw of the second switch.

A resistive load can be connected to the load side of the first switch, the load side of the second switch, and the load side of the third switch. The resistive load can be included in an aircraft galley oven, i.e. an oven aboard an aircraft. The resistive load can include three resistive elements connected series with one another in a circuit in delta configuration, wherein each of the first, second, and third switches connects to a respective node in series between two respective ones of the three resistive elements. An alternating current power source can have a first phase connected to the supply side of the first switch, a second phase connected to the supply side of the second switch, and a third phase connected to the supply side of the third switch.

A controller can be connected to the first, second, and third voltage detectors to detect voltage anomalies in the first, second, and third switches when the first, second, and third switches are connecting the respective supply sides to the respective NC throws. The controller can be configured to output a signal indicative of a fault upon detection of a voltage anomaly. Another or the same controller can be operatively connected to switch the first, second, and third switches to connect and disconnect the load side from the supply side of the first, second, and third switches.

A method includes monitoring voltage across a normally closed (NC) throw of a first switch and a pole of a second switch for a first voltage anomaly, monitoring voltage across a NC throw of the second switch and a pole of a third switch for a second voltage anomaly, and monitoring voltage across a NC throw of the third switch and a pole of the first switch for a third voltage anomaly.

Monitoring voltage for the first, second, and third anomalies can include sending a fault signal in the event of any of the first, second, and third anomalies. Monitoring voltage for the first voltage anomaly can be performed while a load is connected to the NC throw of the first switch. Monitoring voltage for the second voltage anomaly can be performed while the load is connected to the NC throw of the second switch, and monitoring voltage for the second voltage anomaly can be performed while the load is connected to the NC throw of the third switch.

The method can include switching state of the first switch to connect power to the load through the first switch, switching state of the second switch to connect power to the load through the second switch, and switching state of the third switch to connect power to the load through the third switch. The method can include determining the first, second, and third switches are functioning properly if voltage is detected while monitoring voltages for the first, second, and third anomalies when the first, second, and third switches are in the NC state, assuming an input voltage is present, and if no voltage is detected while monitoring voltages for the first, second, and third anomalies when the first, second, and third switches are in the NO state.

Monitoring voltage for the first, second, and third voltage anomalies can be performed while supplying three-phase alternating current to the poles of the first, second, and third switches respectively. Monitoring for the first, second, and third anomalies can be performed with a single detection circuit. The method can include monitoring with at least one additional detection circuit to power lines to distinguish missing line voltage.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain FIGURES, wherein:

FIG. 1 is a schematic view of an embodiment of a system constructed in accordance with the present disclosure, showing the switches, voltage sensors, and load.

DETAILED DESCRIPTION OF THE PREFERRED EMBODIMENTS

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. The systems and methods described herein can be used to monitor switches such as used for safety switches for galley ovens in aircraft.

The system 100 includes a first switch 102 having a single pole 104 and dual throws 114, 116. The single pole 104 is on a supply side of the first switch 102, i.e. connected to the power supply or source 110. The dual throws 114, 116 are on a load side of the first switch 102, e.g. with the load 112. One of the dual throws 114, 116 include a normally open (NO) throw 114 and a normally closed (NC) throw 116. A second switch 118 has a single pole 120 and dual throws 122, 124. The single pole 120 is on the supply side of the second switch 118. The dual throws 122, 124 are on the load side of the second switch 118, and include a NO throw 122 and a NC throw 124. A third switch 126 has single pole 128 and dual throws 130, 132. The single pole 128 is on the supply side of the third switch 126. The dual throws 130, 132 are on a load side of the third switch 126, and include a NO throw 130 and a NC throw 132.

A first voltage detector 134 is connected from the single pole 104 of the first switch 102 to the NC throw 132 of the third switch 126. A second voltage detector 136 is connected from the single pole 120 of the second switch 118 to the NC throw 116 of the first switch 102. A third voltage detector 138 is connected from the single pole 128 of the third switch 126 to a NC throw 124 of the second switch 118.

The alternating current power source 110 has a first phase A connected to the supply side of the first switch 102, a second phase B connected to the supply side of the second switch 118, and a third phase C connected to the supply side of the third switch 126. The resistive load 112 is connected to the load side of the first switch 102, the load side of the second switch 118, and the load side of the third switch 126. The resistive load 112 can be part of an aircraft galley oven, i.e. an oven aboard an aircraft, or any other suitable device. The resistive load 112 includes three resistive elements 140, 142, 144 connected series with one another in delta configuration in a circuit 146. Each of the first, second, and third switches 102, 118, 126 connects to a respective node 148, 150, 152 in series between two respective ones of the three resistive elements 140, 142, 144. When the switches 102, 118, 126 are in their NO state (the switch connects the single pole to the respective NO throw), the three-phase alternating current power from the source 110 connects to power the resistive elements 140, 142, 144, e.g., heating elements. In this state there is no voltage on the NC throws 116, 124, 132, so no voltage is detected.

A controller 154 is connected to the first, second, and third voltage detectors 134, 136, 138 to detect, e.g. using logic gates, voltage anomalies in the first, second, and third switches 102, 118, 126 when the first, second, and third switches 102, 118, 126 are connecting the respective supply sides (i.e. poles 104, 120, 128) to the respective NC throws 116, 124, 132. The controller 154 is configured to output a signal indicative of a fault upon detection of a voltage anomaly. Another or the same controller 154 is operatively connected, as indicated by the broken line in FIG. 1 to switch the first, second, and third switches 102, 118, 126 to connect and disconnect the load side, i.e. the throws 114, 122, 130, from the supply side or poles 104, 120, 128 of the first, second, and third switches 102, 118, 126. In short, the controller 154 connects and disconnects the load 112 from the power source 110 by controlling the states of the switches 102, 118, 126, and also monitors the switches 102, 118, and 126 for voltage anomalies indicative of a fault.

A method includes monitoring voltage across a normally closed (NC) throw, e.g. throw 116, of a first switch, and a pole, e.g. pole 120, of a second switch for a first voltage anomaly, monitoring voltage across a NC throw, e.g. throw 124, of the second switch and a pole, e.g. pole 128, of a third switch for a second voltage anomaly, and monitoring voltage across a NC throw, e.g. throw 132, of the third switch and a pole, e.g. pole 104, of the first switch for a third voltage anomaly. This can include sending a fault signal in the event of any of the first, second, and third anomalies, e.g. using outlet line 156. This monitoring process can be performed while a load, e.g. load 112, is connected to the normally closed NC throw 114, 122, 130, e.g. while the power source 110 is powering the load 112, and can also be performed when the switches 102, 118, 126 disconnect the load 112 from the source 110. When the load 112 is supposed to be enabled (NO contact state), then the voltage detectors 134, 136, 138 should not detect a voltage. When the load is disabled (NC contact state) the voltage detectors 134, 136, 138 should detect a voltage. If there is a deviation from these states, there is a voltage anomaly, indicative of a possible fault in on or more of the switches 102, 118, 126.

The method includes switching state of the first, second, and third switches to connect power to the load through the first, second, and third switches. The method can include determining the switches are functioning properly if each of the following is true: first, is voltage detected while monitoring voltages when the first, second, and third switches are in the NC state, assuming an input voltage is present, and second, is no voltage is detected when the first, second, and third switches are in the NO state. Other outcomes of the monitoring process are deemed anomalous, and the fault single can be sent.

The systems and methods disclosed herein allow for monitoring for the first, second, and third switches for voltage anomalies using a single detection circuit, e.g. the circuit shown in FIG. 1. The method can include monitoring with at least one additional detection circuit to monitor power lines of source phases A, B, C to distinguish missing line voltage when the switches 102, 118, 126 are in the NO state. While shown and described herein in the context of three-phase alternating current, those skilled in the art having had the benefit of this disclosure will readily appreciate how to apply systems and methods disclosed herein to two-phase alternating current systems, and to systems with a single phase alternating current and a neutral with a dual pole switch, or to any other suitable system.

The methods and systems of the present disclosure, as described above and shown in the drawings, provide for monitoring switches such as safety switches for ovens in aircraft galleys. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method comprising:

monitoring voltage across a normally closed (NC) throw of a first switch and a pole of a second switch for a first voltage anomaly;

monitoring voltage across a NC throw of the second switch and a pole of a third switch for a second voltage anomaly; and monitoring voltage across a NC throw of the third switch and a pole of the first switch for a third voltage anomaly, wherein monitoring voltage for the first voltage anomaly is performed while a load is connected to the normally closed (NC) throw of the first switch, wherein monitoring voltage for the second voltage anomaly is performed while the load is connected to the NC throw of the second switch, and wherein monitoring voltage for the second voltage anomaly is performed while the load is connected to the NC throw of the third switch.

2. The method as recited in claim 1, wherein monitoring voltage for the first, second, and third anomalies includes sending a fault signal in the event of any of the first, second, and third anomalies.

3. The method as recited in claim 1, further comprising: and switching state of the first switch to connect power to the load through the first switch;

switching state of the second switch to connect power to the load through the second switch;

switching state of the third switch to connect power to the load through the third switch.

4. The method as recited in claim 3, further comprising determining the first, second, and third switches are functioning properly if voltage is detected while monitoring voltages for the first, second, and third anomalies when the first, second, and third switches are in the NC state, assuming an input voltage is present, and if no voltage is detected while monitoring voltages for the first, second, and third anomalies when the first, second, and third switches are in the NO state.

5. The method as recited in claim 1, wherein monitoring voltage for the first, second, and third voltage anomalies is performed while supplying three-phase alternating current to the poles of the first, second, and third switches respectively.

6. The method as recited in claim 1, wherein monitoring for the first, second, and third anomalies is performed with a single detection circuit.

7. The method as recited in claim 6, further comprising monitoring with at least one additional detection circuit to power lines to distinguish missing line voltage.

* * * * *